(12) United States Patent
Young et al.

(10) Patent No.: US 8,059,918 B2
(45) Date of Patent: Nov. 15, 2011

(54) HIGH ACCURACY BEAM PLACEMENT FOR LOCAL AREA NAVIGATION

(75) Inventors: Richard J. Young, Beaverton, OR (US); Chad Rue, Portland, OR (US); Peter D. Carleson, Hillsboro, OR (US)

(73) Assignee: FEI Company, Hillsboro, OR (US)

( * ) Notice: Subject to any disclaimer, the term of this patent is extended or adjusted under 35 U.S.C. 154(b) by 142 days.

(21) Appl. No.: 12/577,200

(22) Filed: Oct. 11, 2009

(65) Prior Publication Data

US 2010/0092070 A1   Apr. 15, 2010

Related U.S. Application Data

(60) Provisional application No. 61/104,732, filed on Oct. 12, 2008.

(51) Int. Cl.
G06K 9/32 (2006.01)

(52) U.S. Cl. .......................................... 382/294; 382/295

(58) Field of Classification Search .............. 382/1, 3–4, 382/6–9, 11–15, 17–18, 20–23, 26–27, 29, 382/31, 103, 104, 105, 106, 107, 293, 294, 382/295, 141–152
See application file for complete search history.

(56) References Cited

U.S. PATENT DOCUMENTS

| | | | |
|---|---|---|---|
| 3,326,176 A | 6/1967 | Sibley | |
| 4,393,311 A | 7/1983 | Feldman et al. | |
| 4,451,738 A | 5/1984 | Smith | |
| 4,683,378 A | 7/1987 | Shimase et al. | |
| 5,054,097 A | 10/1991 | Flinois et al. | |
| 5,086,230 A | 2/1992 | Adachi et al. | |
| 5,159,643 A | 10/1992 | Kaga et al. | |
| 5,278,408 A | 1/1994 | Kakibayashi et al. | |
| 5,401,972 A | 3/1995 | Talbot et al. | |
| 5,541,411 A | 7/1996 | Lindquist et al. | |
| 5,905,266 A | 5/1999 | Larduinat et al. | |
| 7,002,513 B2 | 2/2006 | Brabec et al. | |
| 7,221,314 B2 | 5/2007 | Brabec et al. | |
| 7,227,976 B1 * | 6/2007 | Jung et al. | 382/103 |
| 7,351,966 B1 | 4/2008 | Marchman et al. | |
| 7,442,916 B2 | 10/2008 | Lee et al. | |
| 2005/0264445 A1 | 12/2005 | Brabec et al. | |
| 2006/0177120 A1 * | 8/2006 | Ghinovker et al. | 382/151 |
| 2006/0204073 A1 * | 9/2006 | Ghinovker et al. | 382/144 |
| 2008/0061219 A1 | 3/2008 | Lee et al. | |
| 2008/0067369 A1 | 3/2008 | Marchman et al. | |

FOREIGN PATENT DOCUMENTS

WO   2010042916 A4   4/2010

* cited by examiner

*Primary Examiner* — Brian Le

(74) *Attorney, Agent, or Firm* — Scheinberg & Griner, LLP; David Griner; Michael O. Scheinberg

(57) ABSTRACT

An improved method of high accuracy beam placement for local area navigation in the field of semiconductor chip manufacturing. This invention demonstrates a method where high accuracy navigation to the site of interest within a relatively large local area (e.g. an area 200 µm×200 µm) is possible even where the stage/navigation system is not normally capable of such high accuracy navigation. The combination of large area, high-resolution scanning, digital zoom and registration of the image to an idealized coordinate system enables navigation around a local area without relying on stage movements. Once the image is acquired any sample or beam drift will not affect the alignment. Preferred embodiments thus allow accurate navigation to a site on a sample with sub-100 nm accuracy, even without a high-accuracy stage/navigation system.

35 Claims, 12 Drawing Sheets

HIGH ACCURACY BEAM PLACEMENT FOR LOCAL AREA NAVIGATION

This application claims priority from U.S. Provisional Application No. 61/104,732, filed on Oct. 12, 2008, which is hereby incorporated by reference.

TECHNICAL FIELD OF THE INVENTION

The present invention relates to stage navigation and beam placement in particle beam systems and, in particular, to high accuracy local area navigation to a site of interest on a sample surface using acquisition of a high resolution image by FIB or SEM means.

BACKGROUND OF THE INVENTION

Semiconductor manufacturing, such as the fabrication of integrated circuits, typically entails the use of photolithography. A semiconductor substrate on which circuits are being formed, usually a silicon wafer, is coated with a material, such as a photoresist, that changes solubility when exposed to radiation. A lithography tool, such as a mask or reticle, positioned between the radiation source and the semiconductor substrate casts a shadow to control which areas of the substrate are exposed to the radiation. After the exposure, the photoresist is removed from either the exposed or the unexposed areas, leaving a patterned layer of photoresist on the wafer that protects parts of the wafer during a subsequent etching or diffusion process.

The photolithography process allows multiple integrated circuit devices or electromechanical devices, often referred to as "chips," to be formed on each wafer. The wafer is then cut up into individual dies, each including a single integrated circuit device or electromechanical device. Ultimately, these dies are subjected to additional operations and packaged into individual integrated circuit chips or electromechanical devices.

During the manufacturing process, variations in exposure and focus require that the patterns developed by lithographic processes be continually monitored or measured to determine if the dimensions of the patterns are within acceptable ranges. The importance of such monitoring, often referred to as process control, increases considerably as pattern sizes become smaller, especially as minimum feature sizes approach the limits of resolution available by the lithographic process. In order to achieve ever-higher device density, smaller and smaller feature sizes are required. This may include the width and spacing of interconnecting lines, spacing and diameter of contact holes, and the surface geometry such as corners and edges of various features.

As a result, careful monitoring of surface features is becoming increasingly important. As design rules shrink, the margin for error in processing becomes smaller. Even small deviations from design dimensions may adversely affect the performance of a finished semiconductor device.

Accordingly, semiconductor customers are requiring high accuracy beam placement to locate features such as single bit fails in memory arrays or locations for circuit edit. Beam shift navigation systems suffer from sample drift, non-linearity in displacement, and are typically limited in field of view. Typical sample stages used on particle beam systems are only accurate to ±1-2 µm. Without a high accuracy stage (like a laser encoded stage) it is not possible to drive the stage directly to the location of interest with accuracy of 100 nm or less. Laser stages may have the capability for 100 nm accuracy but are expensive and limit the system flexibility as the stage generally cannot be tilted, thereby losing functionality. Further, it is desirable to drive sample stages within an accuracy of approximately 30 nm, which is beyond the capability even of typical laser stages.

Thus, there is still a need for an improved method for high accuracy navigation to the site of interest within a local area on a semiconductor surface that will allows beam placement at an accuracy beyond the positional accuracy of the sample stage. Further, there is a need for such an improved method to be suitable for complete or partial automation.

SUMMARY OF THE INVENTION

It is an object of the invention, therefore, to provide an improved method for high accuracy navigation to the site of interest within a local area on a semiconductor surface, particularly in a particle beam system such as a FIB or SEM.

This invention demonstrates a method where high accuracy navigation to the site of interest within a local area (e.g. 200 um on a side) is possible using imaging/patterning techniques provided there are visible reference marks within the local area with a known coordinate relationship to the target site. A high resolution image of the target area of approximately 4096 pixels wide is first acquired. Two or more alignment features are located near the target area. The area of interest is overlaid with CAD polygons onto the image. Digital zoom is utilized to precisely locate the alignment points and a two or three point CAD polygon re-registration is performed.

Once the image and the coordinate system have been properly aligned, the alignment can be transferred to the sample itself by way of one or more transfer fiducials. One or more readily identifiable features on the sample in the vicinity of the feature of interest are selected and the offset between the transfer fiducial(s) and the feature of interest is recorded. The sample can then be re-imaged at a much smaller field of view based upon the coordinate system alignment. Once the transfer fiducials are identified in the second image, the recorded offsets can be used to locate the feature of interest and accurately position the particle beam.

According to preferred embodiments of the present invention, the combination of large area, high resolution scanning, digital zoom and registration of the image to an idealized coordinate system enables navigation around a local area without relying on stage movements. Once the image is acquired any sample or beam drift will not affect the alignment.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

The accompanying drawings are not intended to be drawn to scale. In the drawings, each identical or nearly identical component that is illustrated in various figures is represented by a like numeral. For purposes of clarity, not every component may be labeled in every drawing.

DETAILED DESCRIPTION OF PREFERRED EMBODIMENTS

Figure 1:
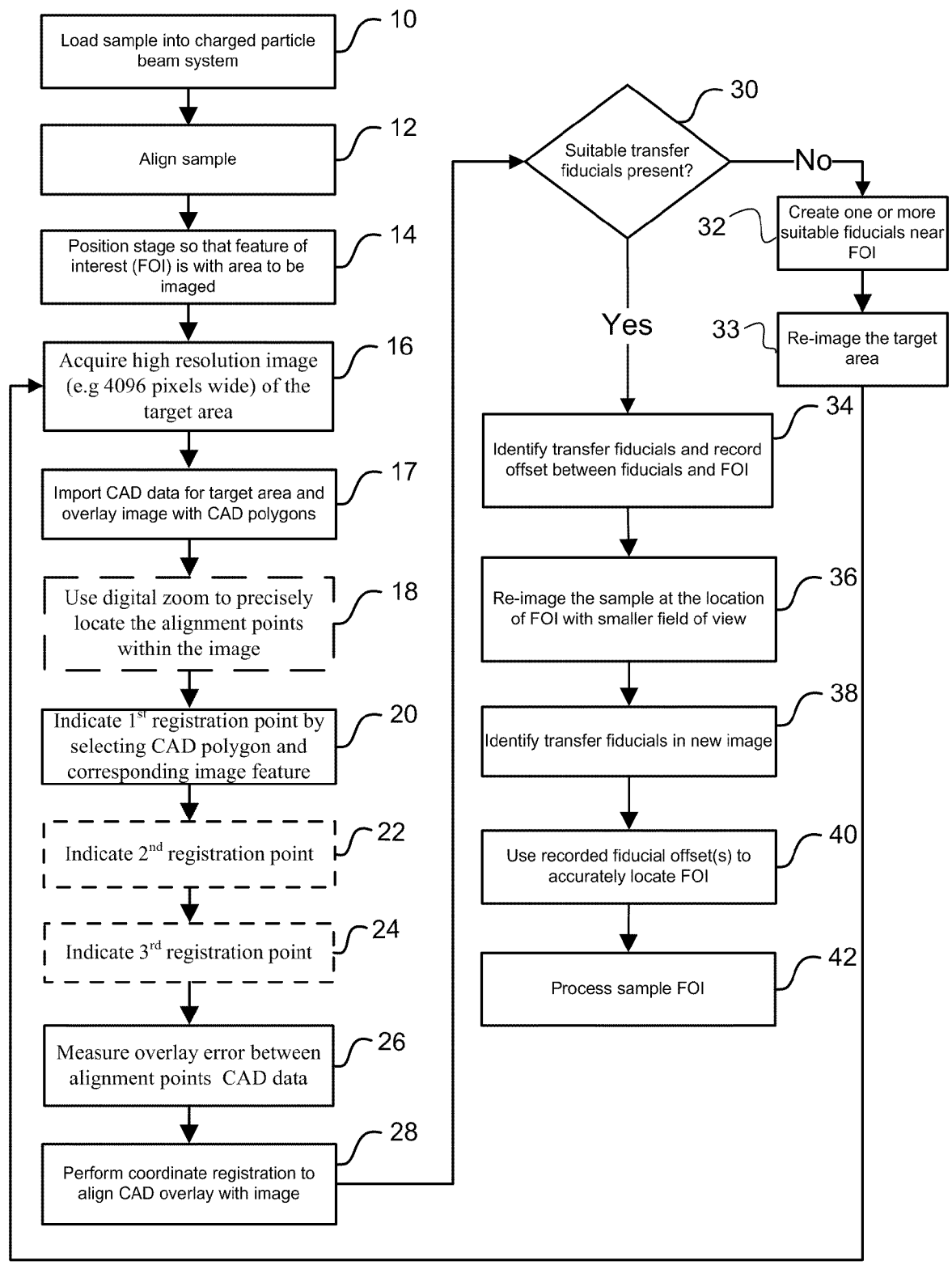
FIG. 1 is a flowchart showing the steps of high accuracy beam placement for local area navigation utilizing stageless navigation according to a preferred embodiment of the present invention.

Preferred embodiments of the present invention are directed at methods for high accuracy beam placement for local area navigation in the field of semiconductor chip manufacturing. This invention demonstrates a method where high accuracy navigation to the site of interest within a relatively large local area (e.g. an area 200 µm×200 µm) is possible even where the stage/navigation system is not normally capable of such high accuracy navigation.

According to preferred embodiments of the present invention, a high-resolution image of a relatively large target area (a larger area including the location of a feature of interest and one or more suitable alignment marks) is first acquired. For example, a suitably high-resolution area might be 250 µm wide with a resolution approximately 4096 pixels wide. According to one preferred embodiment, the area of interest is overlaid with CAD polygons and a two or three point CAD polygon re-registration is performed. Digital zoom is then utilized to precisely locate the area containing the feature of interest. An additional CAD registration process can be performed for greater accuracy. One or more suitable transfer fiducials are then located or created near the feature of interest and the offset between the fiducial and the feature of interest in the large field of view image is recorded. A smaller field of view image is then acquired that is suitable for performing the inspection/investigation. The transfer fiducial is identified in this image and the offset used to accurately locate the feature of interest.

The combination of large area, high-resolution scanning, digital zoom and registration of the image to an idealized coordinate system enables navigation around a local area without relying on stage movements. Once the image is acquired any sample or beam drift will not affect the alignment. Preferred embodiments thus allow accurate navigation to a site on a sample with sub-100 nm accuracy—with some preferred embodiments allowing navigation within 30 nm—even without a high-accuracy stage/navigation system. In other words, according to preferred embodiments of the present invention, the sample stage can have a positioning accuracy or error of ±500 nm or greater while the feature of interest can be located and the particle beam can be positioned relative to the sample with a positioning accuracy of ±100 nm or better (i.e., within 100 nm or less). More preferably the feature of interest can be located (i.e., the particle beam system can navigate to the location of the feature of interest on the sample) with an accuracy within ±30 nm or better. Even where the sample stage has a positioning accuracy or error of ±100 nm or greater, preferred embodiments of the present invention allow the feature of interest to be located and the particle beam to be positioned relative to the sample with a positioning accuracy of ±300 nm or better.

A preferred method or apparatus of the present invention has many novel aspects, and because the invention can be embodied in different methods or apparatuses for different purposes, not every aspect need be present in every embodiment. Moreover, many of the aspects of the described embodiments may be separately patentable.

Figure 12:
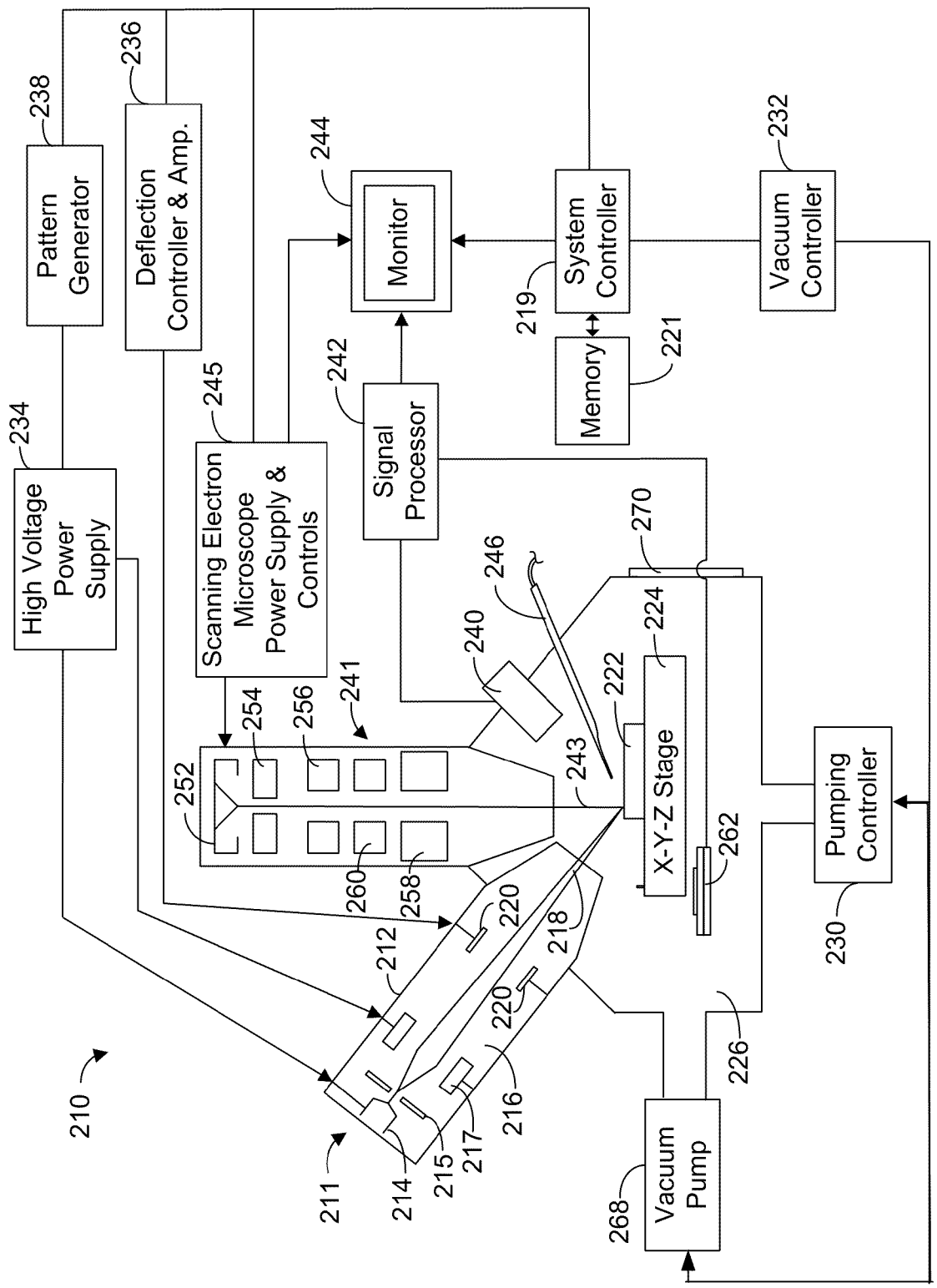
FIG. 12 shows a typical dual beam FIB/SEM system that could be used to implement aspects of the present invention.

FIG. 1 shows a flowchart showing the steps of high accuracy beam placement for local area navigation according to a preferred embodiment of the present invention. In step 10, the sample is loaded into a typical prior-art charged particle beam system (such as the FIB/SEM illustrated in FIG. 12 and described below) by mounting the sample on the system stage. The charged particle beam system according to a preferred embodiment of the present invention can be a focused ion beam system, an electron beam system, or a dual beam FIB/SEM system. The sample can be loaded manually or automatically, for example by an automatic handler system.

Preferred embodiments of the present invention do not require the use of a high-accuracy stage such as a laser stage. When a sample or workpiece is loaded into a charged particle beam system for analysis or processing, it can be very challenging to drive the stage to the precise location of a feature of interest. Typical sample stages have an accuracy of approximately 1-2 µm. In other words, when such a typical stage is moved to a particular coordinate, the error in position can be up to ±1-2 µm. (When expressed in this fashion, a larger number means a less accurate stage.) Advanced high-accuracy stages, such as laser interferometer stages (hereinafter "laser stages") which are capable of navigation within accuracy of 100 nm or less are very expensive. Laser stages also have some significant disadvantages in that they typically do not tilt and they are not available on the majority of charged particle beam systems currently in use. The present invention provides a method of navigation with sub-100 nm accuracy that does not require a high-accuracy laser stage. Preferably, embodiments of the present invention provide a method of sub-100 nm navigation or beam placement using a sample stage with an accuracy (positional error) of ±500 nm. More preferably, embodiments of the present invention provide a method of sub-100 nm navigation or beam placement using a sample stage with an accuracy (positional error) of ±1-2 μm or greater.

After the sample is loaded, in step 12, the sample is aligned using known methods, for example by a typical three point lock on the corners of the die. This alignment can also be accomplished manually, for example by an operator using an optical microscope, or automatically, for example by using an automatic handler robot which locates a notch or flat edge of the sample in order to determine the proper orientation.

In step 14, the stage is positioned so that the location of the feature of interest is within the target area to be scanned by the charged particle beam (the field of view). (In some cases, the feature of interest may not actually be visible in the image, such as for example when the feature of interest is buried.) This positioning can be accomplished, for example, by storing and using positional coordinates or computer-aided design (CAD) data. The field of view should be large enough so that, considering the accuracy of the stage/system being used, it is assured that the feature of interest is within area to be imaged, preferably along with one or more appropriate alignment features suitable for use in registering the image with a coordinate system representing the locations of features on the sample surface (as discussed in greater detail below). More preferably, the field of view will include at least three features suitable for use as alignment features. Suitable features should be easily recognizable in the sample image and in the coordinate system overlay.

In step 16, sample is imaged at high resolution with the charged particle beam. The image must be of sufficient (high enough) resolution so that the pixel size is comparable to the placement precision required. The image resolution is preferably high enough that the pixel size allows the alignment marks to be identified and their locations accurately determined. More preferably the resolution is high enough that the pixel size is the same size of smaller than the size of the alignment features. For example, in a preferred embodiment of the present invention, this means that for a 250 μm wide image a resolution of 4096 (or greater) pixels could be used, resulting in pixels of about 50-60 nm in size. As a result, alignment features larger than 50-60 nm could easily be identified. Other preferred embodiments of the present invention use image resolution resulting in a pixel size of 10-100 nm, more preferably pixel sizes of 30-60 nm.

In some preferred embodiments, resolution resulting in a pixel size that is larger than the size of the feature of interest could also be used, although the larger pixel size would contribute to positional error. For example, if the pixel sizes in the embodiment described in the preceding paragraph were used (50-60 nm) with an alignment feature 30 nm in size, there would be no way to determine where the alignment feature was positioned within the pixel. As a result, the positional error (resulting solely from the pixel size) of the alignment feature could be as much as 20-30 nm (50-60 nm minus 30 nm). Since this degree of accuracy is still more than can be achieved even by typical laser stages, this degree of accuracy will be acceptable in many cases.

The location of the target (feature of interest) and preferably the location of the alignment features should also be known in some form of coordinate system. In preferred embodiments, the locations can be determined from a CAD overlay (as described in greater detail below) or x, y coordinates or else the structure is a repeating array.

The image should be of sufficient resolution that the pixel size is at least comparable to the precision required. For example, in one preferred embodiment, a 250 μm wide image would be approximately 4096 pixels wide, resulting in pixels about 60 nanometers in size. This would be suitable for imaging or processing features, such as the alignment points, that are 60 nanometers in size or larger. However, a higher resolution (and resulting smaller pixel size) would be required for features that are smaller than 60 nm.

There is a direct balance between field of view (also called horizontal field width or HFW) image resolution and pixel spacing: HFW=(pixel spacing)*(number of pixels). To navigate over an area much larger than 250 μm×250 μm ones demonstrated here would result in a likely reduction in the accuracy obtainable due to larger pixel spacing and possible scan distortions unless the resolution of the patterning engine was increased to 8 k or 16 k wide images. In some cases, mapping may be required to understand any scan distortions/non-linearities.

Figure 2:
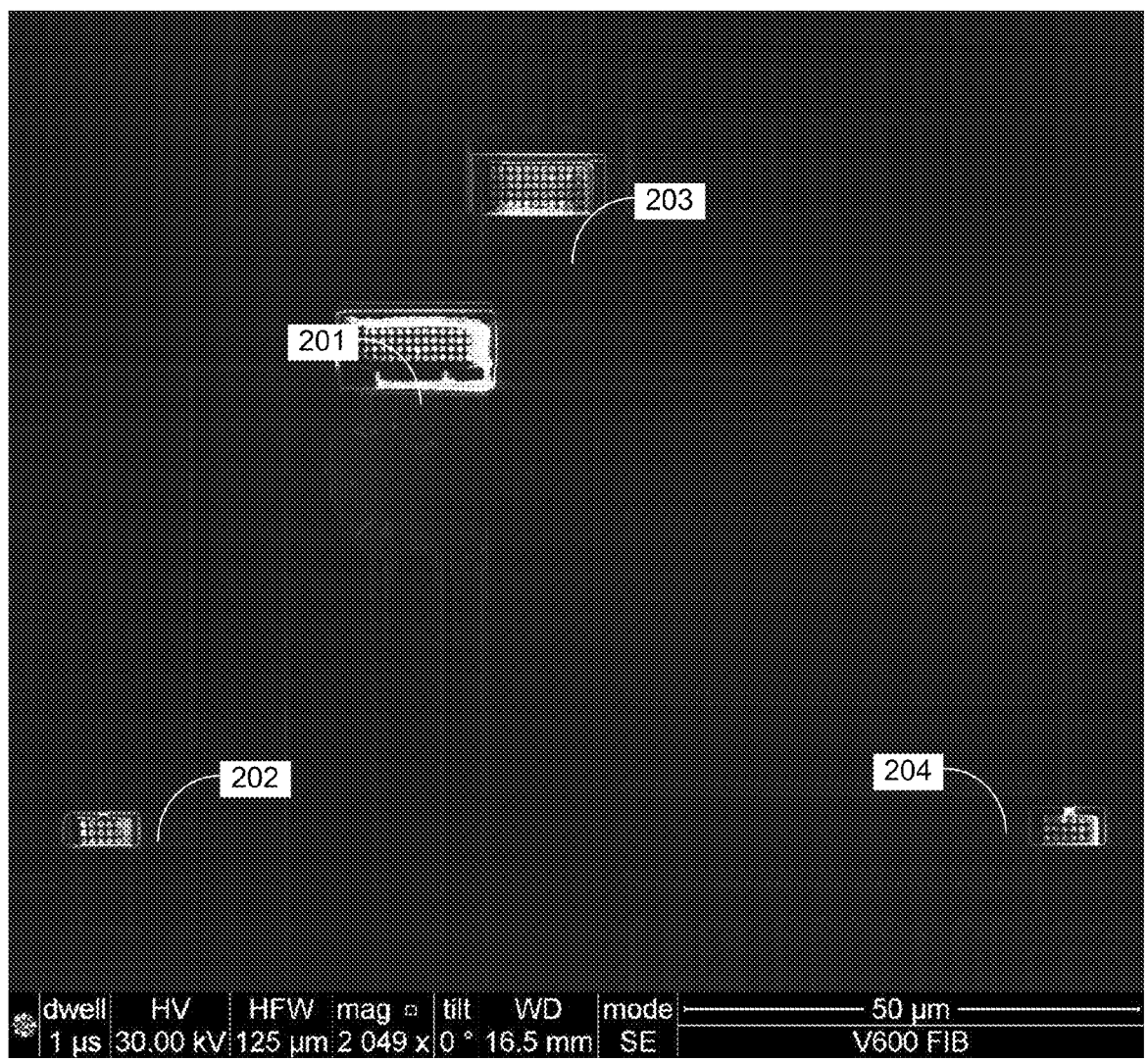
FIG. 2 shows an image of a sample including a target and alignment features to be used in the initial image/CAD overlay registration according to a preferred embodiment of the present invention.

FIG. 2 shows an image of a sample obtained as described above by driving the stage to the coordinates for a feature of interest and three alignment features to be used in the initial image/CAD overlay registration (described below). As shown in FIG. 2, the target 201 (containing the feature of interest) and the three alignment features (202, 203, 204) are all via fields, which have been partially exposed on a semiconductor surface by milling through a surface layer. The field of view should be large enough so that, considering the accuracy of the stage/system being used, it is assured that the location of the feature of interest is within the area to be imaged. For example, in a particle beam system with a sample stage having an accuracy of ±2 μm, the field of view for a feature of interest and three alignment features approximately 2000 nm apart should be at least 8 μm×8 μm to ensure that the feature of interest is within the field of view imaged. Typically, however, a much larger field of view of approximately 125 μm ×125 μm could be used according to the present invention.

Figure 3:
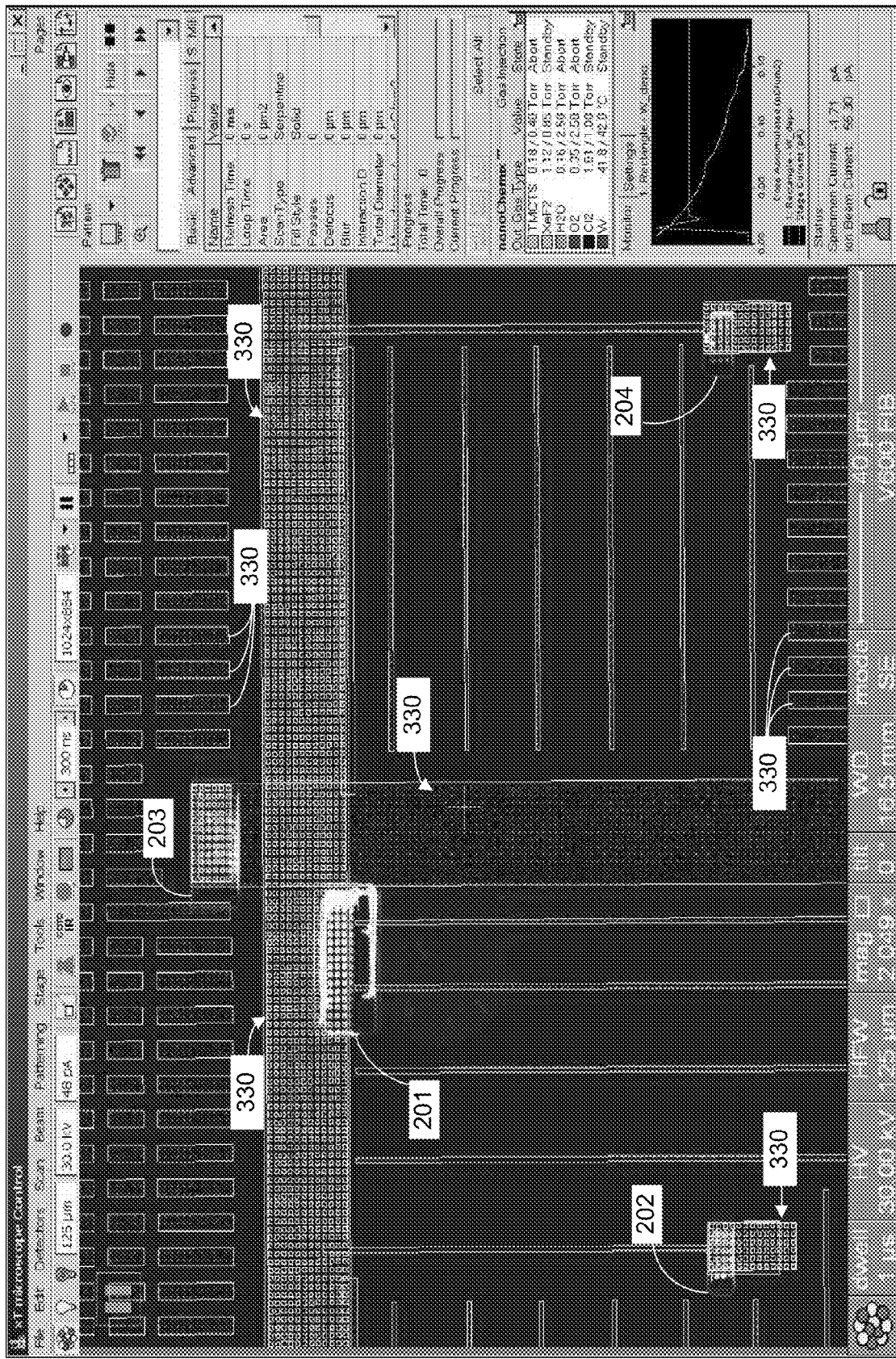
FIG. 3 shows the image of FIG. 2 with an overlay showing the CAD polygons prepared from the CAD data superimposed on the image.

Referring again to FIG. 1, in step 17 an overlay showing the CAD polygons 330 (idealized geometric shapes that represent the locations of features on the sample or workpiece) can be constructed from the computer-aided design (CAD) data for the elements/features on the semiconductor sample and superposed on the charged particle beam image of the sample. Such a coordinate system overlay is shown in FIG. 3. If necessary, an initial registration between the CAD overlay and the image can be performed as described below. Note that in FIG. 3, a number of the semiconductor features indicated by the CAD polygons have not been exposed and are still buried under the surface layer.

Figure 4:
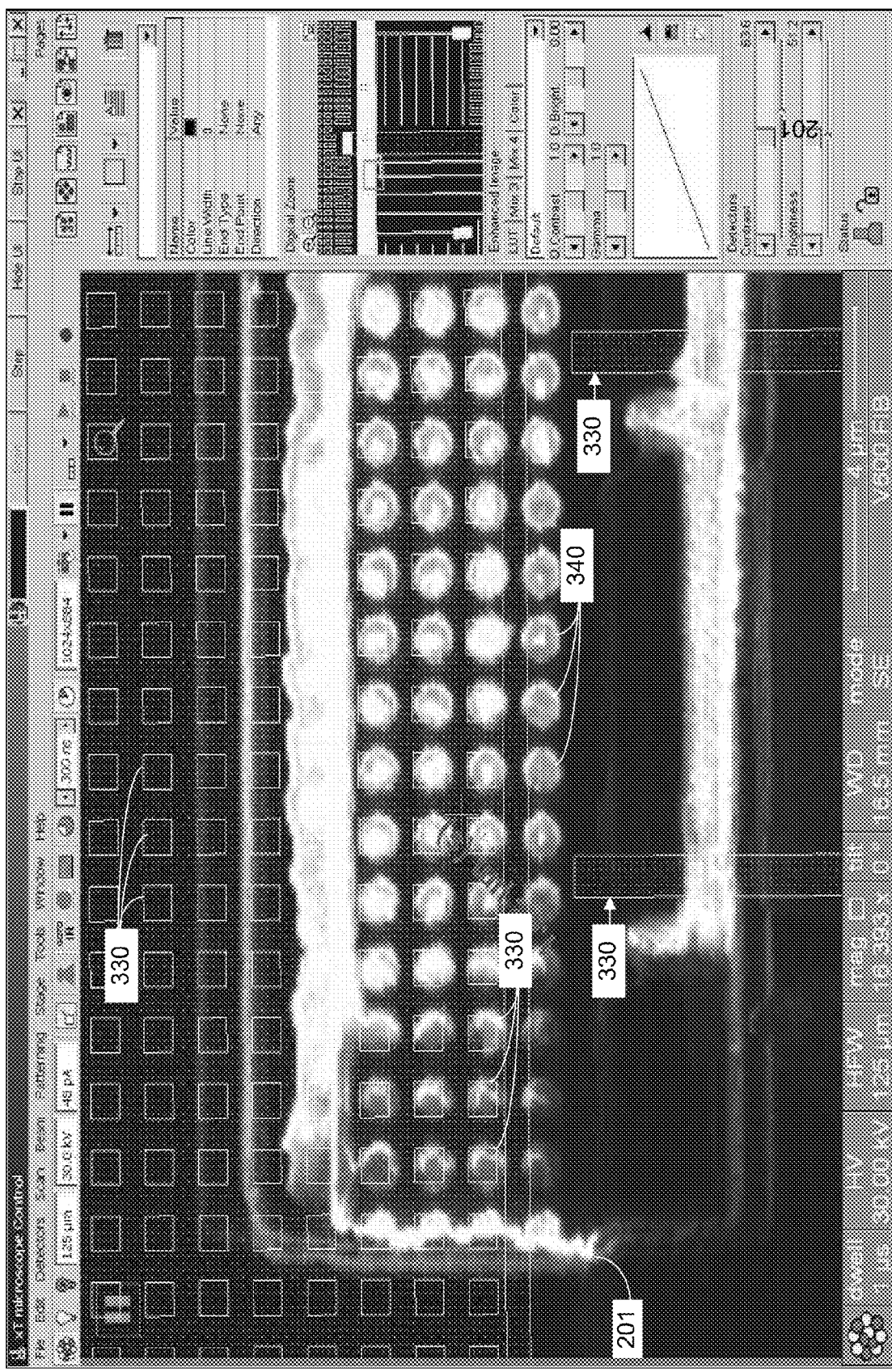
FIG. 4 shows the image and the CAD overlay of FIG. 3 at a higher magnification using digital zoom.

Typically, as shown in FIGS. 3 and 4, the initial positioning of the overlay relative to the image will likely be somewhat inaccurate. In optional step 18, digital magnification can be used to zoom in on the target and the alignment points. Once the target area has been scanned, the use of digital zoom allows a user to "navigate" the scanned image to locate fiducials or the feature of interest. It is much quicker and easier to navigate around in the image than it would be to navigate by moving the stage and re-imaging the sample. Digital zoom (for example, on the order of 8:1 zoom in FIG. 4) allows the user to quickly locate the general area containing a feature of interest and then to zoom in to more accurately locate the feature of interest, alignment features for use with the coordinate overlay, and/or transfer fiducials as described below. In FIG. 4, the magnified image makes it clear that the vias 340 are not properly aligned with the CAD polygons 330.

In preferred embodiments of the present invention, the use of digital zoom allows an operator to zoom in on the image (and the CAD overlay) at or near the feature of interest in order to perform a coordinate system registration between the image and the overlay in order to more accurately align the image with the CAD overlay. As persons of ordinary skill in the art will recognize, the use of digital zoom helps overcome inherent limitations in the level of detail that can be visually displayed to a human operator, for example on a computer monitor. In some preferred embodiments of the present invention, however, automated computer control can be used instead of human operators, for example by using image recognition/machine vision. The use of digital zoom would obviously not be necessary for automated embodiments.

Figure 5:
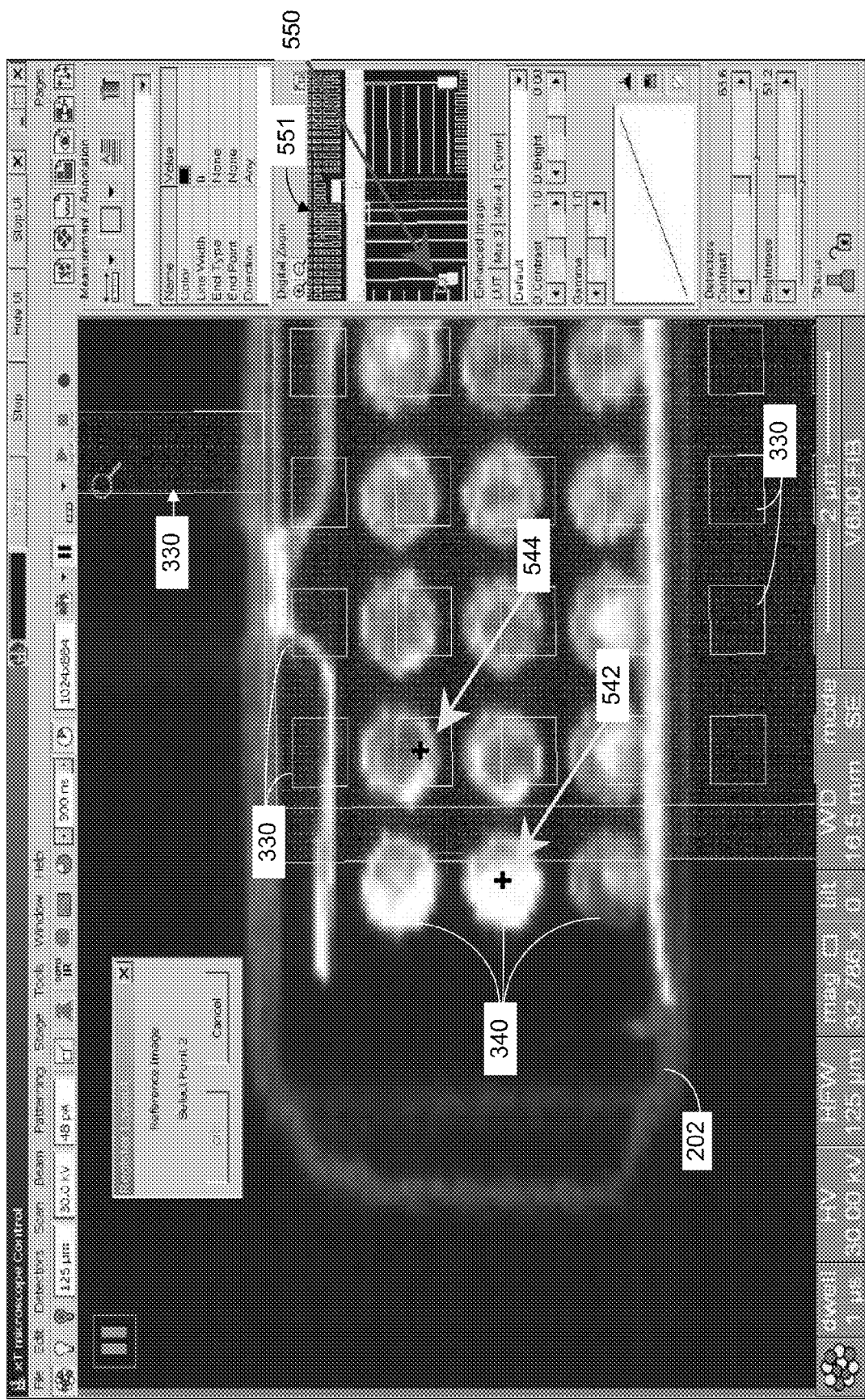
FIG. 5 shows the image of FIG. 4 in which a first point in the CAD overlay and the corresponding feature in the image have been selected for a registration of the image and the CAD overlay.
Figure 6:
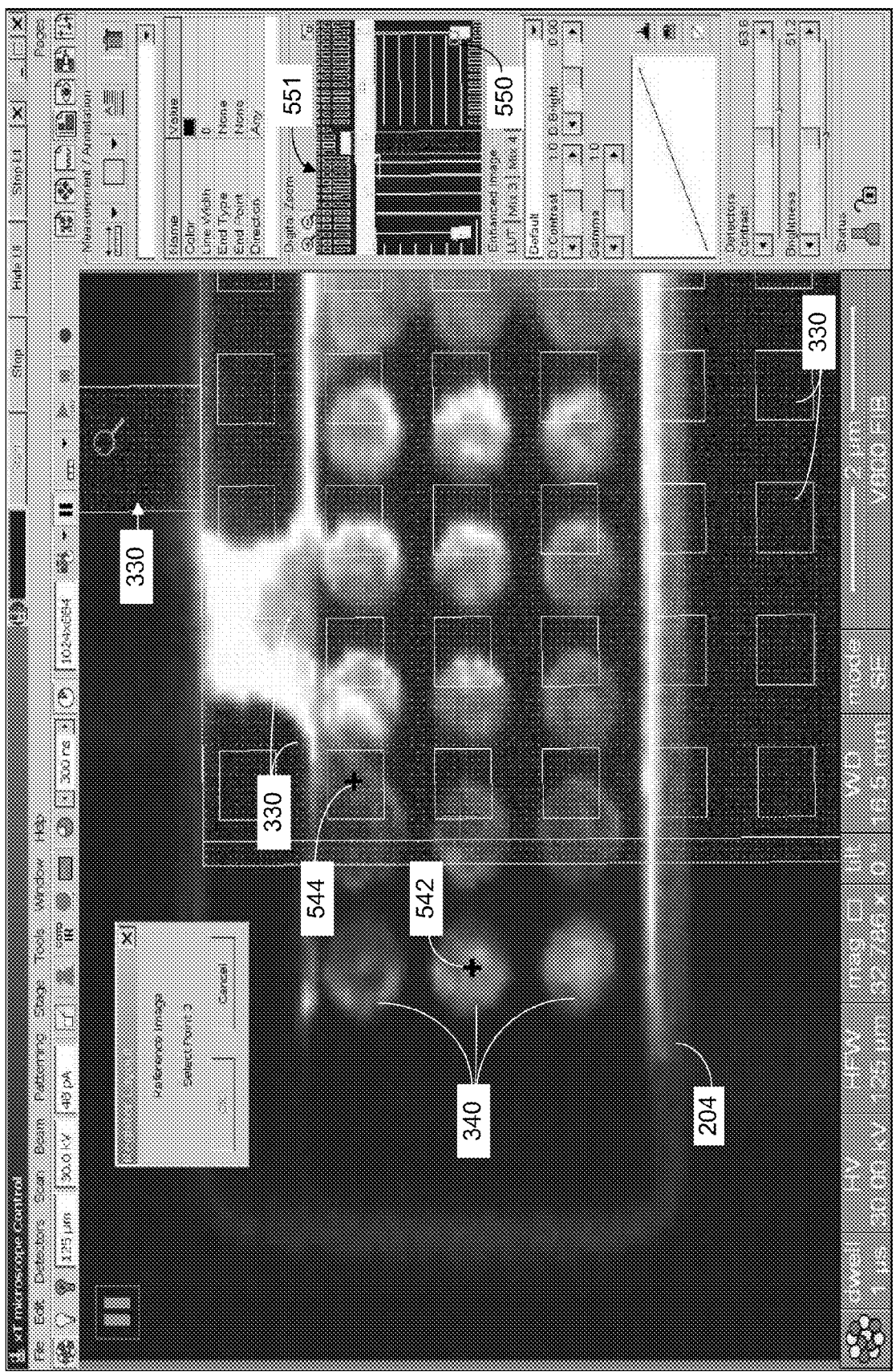
FIG. 6 shows the image of FIG. 4 in which a second point in the CAD overlay and the corresponding feature in the image have been selected for a registration of the image and the CAD overlay.
Figure 7:
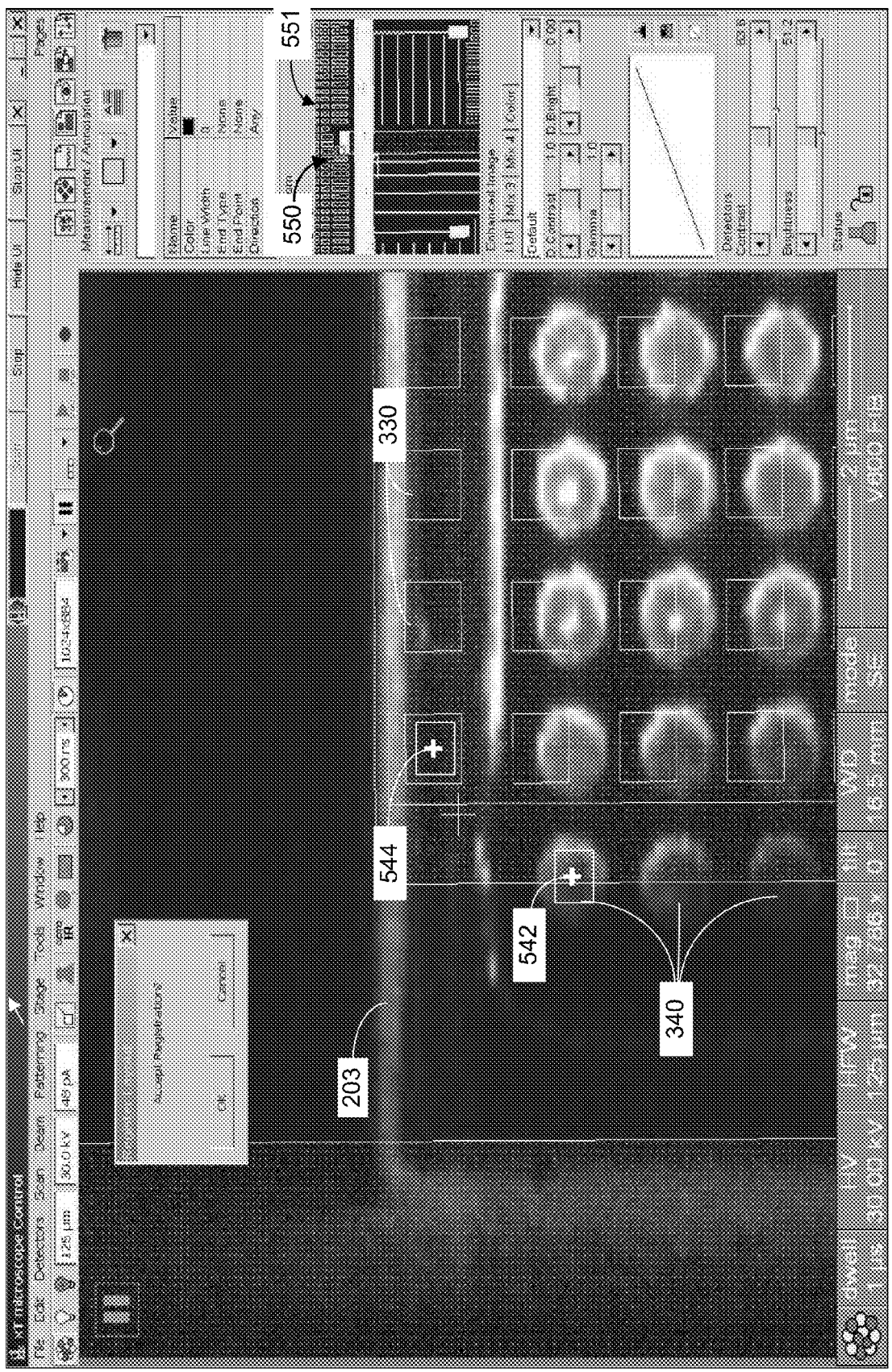
FIG. 7 shows the image of FIG. 4 in which a third point in the CAD overlay and the corresponding feature in the image have been selected for a registration of the image and the CAD overlay.

The alignment points and corresponding elements on the coordinate system overlay can then be identified, for example by using a computer pointing device such as a mouse and on-screen cursor. FIG. 5 shows the first step in the re-registration process. Using digital magnification, the user can zoom-in on the image and CAD overlay and specify a local offset for various regions within the image. The region that is being digitally magnified is shown as a square 550 in thumbnail view 551. As shown in FIG. 5, the image has been digitally zoomed at alignment point 202. Referring again to FIG. 1, in step 20—as illustrated in FIG. 5—an operator can click (with a mouse or other suitable pointing device) the center 544 of one of the CAD polygons 330 and then click in the center 542 of the corresponding feature (via 340) in the sample image. The process is can then be repeated for alignment feature 204 as shown in FIG. 6 (step 22) and at alignment feature 203 as shown in FIG. 7 (step 24).

Once the locations of the alignment features and the corresponding elements in the coordinate system overlay have been identified, the offset or overlay error in the target region between the alignment points on the image and the CAD overlay can then be measured in step 26. The error in FIG. 4 is about 1.4 um in the target region. To correct this error, a three-point re-registration will be performed in step 28 and the CAD overlay is stretched, rotated and/or shifted to create a match to the image.

As persons of ordinary skill in the art will recognize, the offset errors between the CAD overlay and the image can arise from many sources: operator error in the original stage lock, imprecise calibration of the FIB image (magnification and/or rotation), local die distortions, or non-linearities in the ion column deflection system, to name a few. Whatever the source of the errors, it is usually impossible to achieve perfect correspondence between a CAD overlay and every point within a large field-of-view FIB image. One solution to this problem is to perform a 3-point re-registration that stretches, shifts, and/or rotates the CAD overlay as needed to create a customized match of a particular FIB image. This type of image registration is discussed in detail in U.S. Pat. No. 5,541,411 to Lindquist et al. for "Image-to-Image Registration Focused Ion Beam System," assigned to FEI Company of Hillsboro, Oreg., also the assignee of the present invention, and incorporated herein by reference.

As described by Lindquist and as shown by FIGS. 5-8, the registration operation comprises selecting, for example, three points on the particle beam image and three corresponding points on the other image to be aligned (such as a CAD overlay according to a preferred embodiment of the present invention). The alignment points can be selected interactively via use of mouse in conjunction with visual feedback from display. For example, if alignment points R1, R2 and R3 are chosen as alignment points visible in the particle beam image, the three corresponding points (C1, C2, C3) are selected the coordinate system overlay for which registration is desired. Once the corresponding points in the image and coordinate system are chosen, the process determines a transform T between the points of the reference image (R1, R2, R3) and the points on the prior image (C1, C2, C3) such that T(C1)=R1, T(C2)=R2, and T(C3)=R3. Since the coordinate locations of the points are known within the particular coordinate system of the screen, the transformation between points is readily determined by linear algebra methods.

Once the transform operation T has been determined, then a new empty (i.e., blank) image is created, then a loop is entered and a first pixel is selected in the new image. Once the pixel is selected, a determination is made as to whether all pixels have been processed. If all pixels have been processed, then the registration is completed and the process exits. However, if all pixels have not been processed, then the process continues using the coordinate transform T and a corresponding pixel from the prior image is selected. The selected pixel data from the prior image is then read from the prior image into the selected pixel position of the new image. If the transform has mapped the selected position of the new image outside of the boundary of the prior image, then null data is placed in the new image position. This null data could comprise a blank representation or a black background representation, for example. Next, the process loops back, to again select a next pixel in the new image and the process continues in an iterative manner until such time as all pixels in the new image have been processed.

Figure 8:
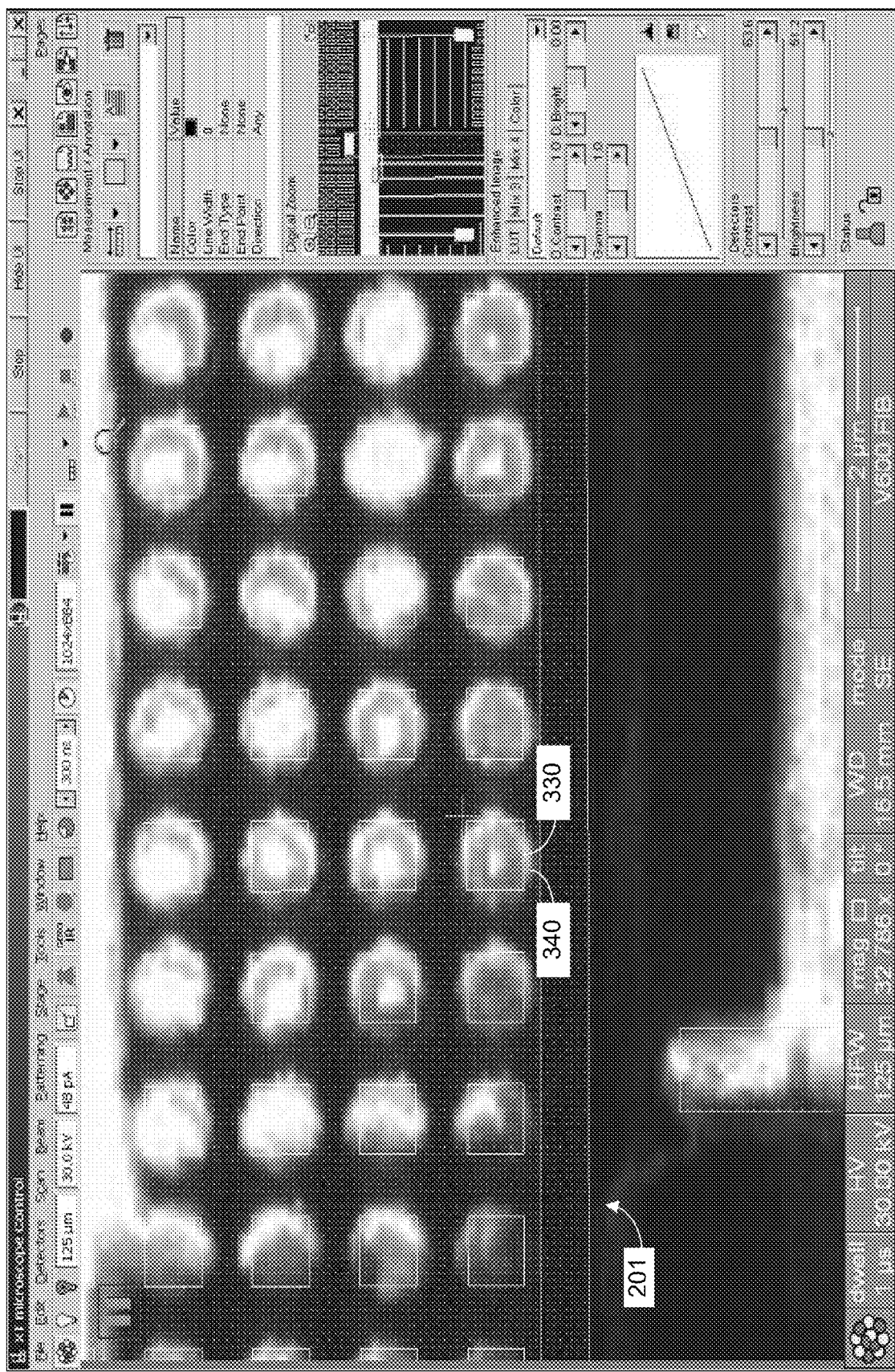
FIG. 8 shows the image and CAD overlay after 3-point registration has been completed.

In a preferred embodiment the calculation of offset and the registration of the image and CAD polygons are performed by way of an automated computer script. After registration is complete, the overlay and target vias are now properly aligned, as shown in FIG. 8.

The new image may be somewhat skewed relative to the original images, since the transform operation will accommodate translation, rotation, scaling and tilt angle differences between the images. According to the above described steps, image-to-image registration is preferably accomplished by selecting three corresponding alignment points in the charged particle image and the coordinate system, although different numbers of alignment points could be used with more points providing a more accurate alignment. A transformation between the corresponding alignment points is determined and applied to the images to be registered to produce an appropriately registered output image. Alternatively, an optional step to improve accuracy is to image additional sites with other alignment features close to the target site. The target site is then determined by averaging the position indicated by the separate images. This step is especially desirable to providing good accuracy when a single alignment features is used per image. The steps are suitably performed by a computer processor, wherein the various images are bit mapped images stored in image buffer and shown on an appropriate display.

Once the image and the coordinates system have been properly aligned, that alignment then needs to be "transferred" to the sample itself. According to preferred embodiments of the present invention, this can be accomplished by the use of transfer fiducials. Factors such as system drift and image shifts and scaling differences when changing fields of view make the positioning of a charged particle beam somewhat variable at the nanometer scale. The use of transfer fiducials allows independent reference points to quickly and precisely locate a feature of interest. A transfer fiducial can either be an existing and easily identifiable feature on the sample (as seen in the image) or one created by the FIB/SEM as part of the alignment process. An existing feature suitable for use as a transfer fiducial should be a unique feature within the field of view that can be consistently identified. A preferred fiducial will also allow the beam location to be pinpointed in both the x and y directions. For example, one suitable fiducial might be the intersection of two lines (a cross-shaped fiducial). A suitable fiducial could also be an irregularity in the sample or even a piece of dirt or debris located within the field of view.

Referring again to FIG. 1, in step 30, after navigating to the location of the feature of interest within the image, one or more suitable transfer fiducials are identified in the image, and the offset between the fiducial(s) and the feature of interest within the image is recorded. Again, digital zoom can be used to magnify the image of the area at the location of the feature of interest to aid in the location of appropriate transfer fiducials. Preferably, two or more transfer fiducials will be used. In general, the greater the number of transfer fiducials used, the greater the accuracy of the location of the feature of interest.

If an appropriate structure is not present on the surface of the sample, in step 32 a fiducial mark can be created at a location within the field of view but separated from the feature of interest, preferably in a location that will not damage the point of interest. For example, a fiducial marker can be created on the sample by FIB milling or FIB/SEM deposition close to the target site. A fiducial may be created using any suitable method, including for example, focused ion beam sputtering, surface staining with an ion beam, gas-assisted etching or deposition, or electron beam induced gas-assisted etching or deposition. In many cases, fiducial formation by deposition will be preferable because it is less invasive (causes less damage to the sample surface) and provides a better contrast (because a different material is used). The fiducial can be made of a shape that is readily distinguishable so that it can be consistently identified and located.

Where an appropriate fiducial is created, in step 33, the sample surface should be re-imaged after the fiducial is created. The alignment steps 16-28 described above can then be repeated with the new image.

Figure 9:
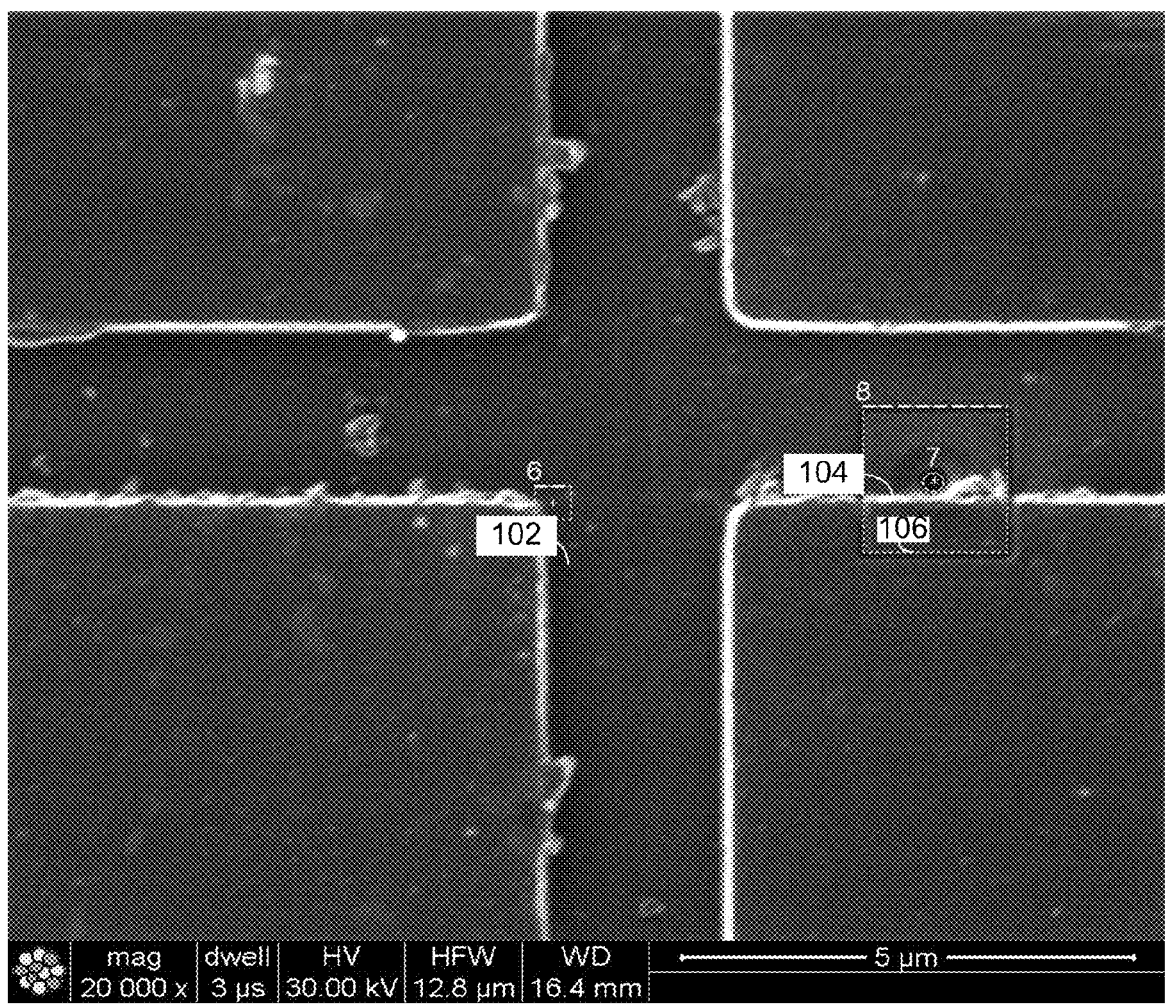
FIG. 9 shows a second charged particle beam image according to the present invention where the image has a smaller field of view and includes the location of the feature of interest and at least one feature that can be used as a transfer fiducial.

In step 34, once suitable transfer fiducials are identified, the offset between the transfer fiducials and feature of interest is determined and recorded (preferably in computer memory). FIG. 9 shows a sample where the corner 102 of a cross pattern has been located using the method described above and two milled fiducials 104 and 106. Using the methods described herein, the location of corner 102 was experimentally determined within <100 nm.

Figure 10:
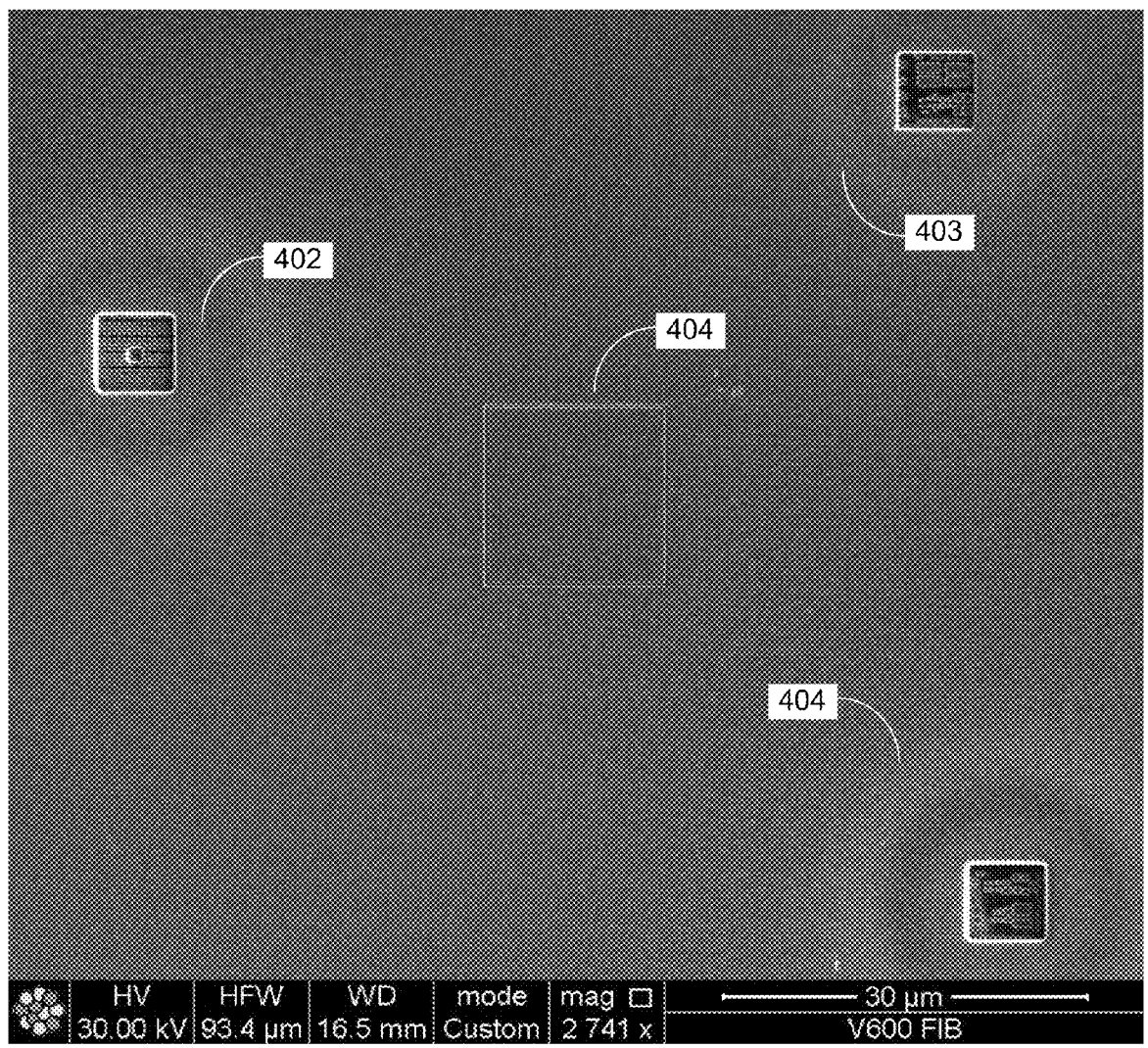
FIG. 10 shows a charged particle beam image according to the present invention where a fiducial frame has been milled around the location of the feature of interest.

Again, the greater number of fiducials created and used, the greater the accuracy of the beam placement in relation to the feature of interest. In a preferred embodiment, a frame or box can be created, for example by ion milling, completely around the location of the feature of interest (although as shown in FIG. 9, frame fiducial 104 was milled around alignment mark 106 rather than the feature of interest 102). Such a milled fiducial frame is shown in FIG. 10, where a buried feature of interest (not yet visible because of the surface layer) is located within fiducial frame 404. Alignment features 402, 403, 404 (which have already been exposed) are also visible in FIG. 10. By using a framing fiducial as shown in FIG. 10, once the feature of interest within the frame is exposed (preferably by milling/etching away the surface layer within the frame) the feature offset can be determined for any point along the frame, essentially providing an infinite number of fiducial locations from which the offset can be determined. This provides for a much more accurate determination of the offset between the fiducial and the feature of interest.

Referring again to FIG. 1, once the appropriate fiducials have been selected or created, in step 36, the sample is re-imaged at the location of the feature of interest. Preferably, a significantly smaller field of view is used for this imaging step. Typically, the field of view will be one that is typical for the desired processing of the feature of interest, for example a 10 μm×10 μm field of view. This smaller field of view can be used with greater confidence because, after the registration steps described above, the location of the feature is known with enough accuracy to ensure that the feature will be within the smaller field of view. The transfer fiducial(s) can then be readily identified in the new image in step 38. And in step 40, the recorded offset(s) are used to easily and accurately locate the feature of interest. Once the beam is correctly positioned, in step 42, the particle beam can be used to process the sample by, for example, milling the sample, depositing material onto the sample, or imaging and performing metrology on the sample.

Figure 11:
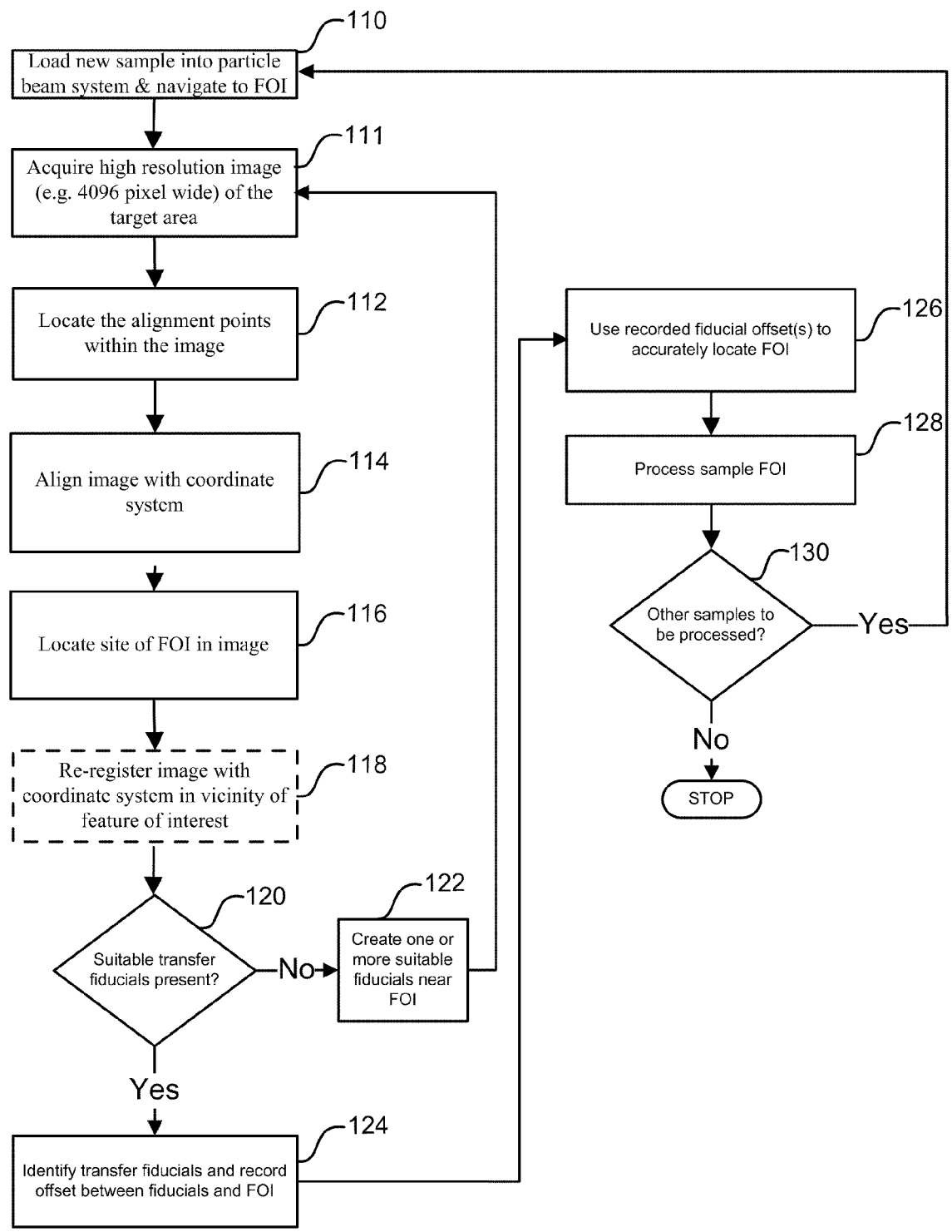
FIG. 11 is a flowchart showing the steps of high accuracy beam placement for local area navigation according to a preferred embodiment of the present invention.

FIG. 11 is a flowchart showing the steps of creating one or more samples according to another preferred embodiment of the present invention (without using a visual overlay of CAD polygons). Preferably, the process described in FIG. 11 can be completely or partially automated.

In step 110, a sample is loaded into a particle beam system. For example, a suitable sample could be a semiconductor wafer, which could be loaded into a dual beam FIB/SEM having a sample stage with an accuracy of only 1-2 μm. The known coordinates of a feature of interest are then used to position the stage so that the feature of interest is within the field of view of the particle beam. Because of the low accuracy of a typical sample stage, the precise location of the feature of interest cannot be identified with sufficient accuracy using coordinates alone.

In step 111, a high resolution image (e.g. 4096 pixel wide) image of the target area is acquired, including two or more alignment points (e.g. identifiable features such as the corners of a 200×200 μm square area). In step 112, the suitable alignment points are located. As described above, suitable alignment features can be identified in the sample image and corresponding elements identified in coordinate system data specifying the locations of features on the sample (such as CAD data for the particular semiconductor wafer).

According to a preferred embodiment of the present invention, suitable alignment features also can be selected automatically using image recognition software. Suitable image recognition software is available, for example, from Cognex Corporation of Natick, Mass. Image recognition software can be "trained" to locate the suitable alignment features by using sample images of similar features or by using geometric information from CAD data. This can be especially desirable where a number of similar samples are to be processed (for example a large number of semiconductor wafers having the same design). Automated FIB or SEM metrology can also be used to identify or help identify the alignment features. Metrology may consist of image-based pattern recognition, edge finding, ADR, center-of-mass calculations, blobs, etc. Suitable software to implement fully or partially automated image processing, metrology, and machine control according to the present invention preferably provides pattern recognition and edge detection tools, along with "do while" looping capabilities, such as the IC3D™ software also available from FEI Company, the assignee of the present invention.

In step 114, the image and the coordinate system of the alignment points are aligned based on calculation of the offset as described in greater detail above. In step 116, this alignment is used to calculate the location of desired feature of interest in image. In optional step 118, a re-registration can be performed in the vicinity of the feature of interest.

In step 120, it is determined whether suitable transfer fiducials are present on the sample surface. Again, transfer fiducials can be selected automatically using image recognition software. Alternatively, suitable transfer fiducials could be selected initially by an operator and the image recognition software "trained" to locate the suitable transfer fiducials in subsequent samples.

If suitable transfer fiducials not present, in step 122, a physical fiducial is created to allow target location. The fiducial can be created to the side of the target area, for example with FIB, SEM, or other known methods, as described above. The offset to the marker should be large enough to make sure that the target site will not be damaged or obscured by the marker. Depending upon the accuracy of the stage, the fiducial might need to be formed several µm away from the feature of interest. The locations for created transfer fiducials could be specified by an operator, for example, by using a mouse to drag a virtual box around the desired fiducial location. Automated metrology software could then precisely measure the location of the fiducial with respect to identifiable features at the sample location (for example 15 nm from the right edge of a particular feature). For processing subsequent samples, a fiducial could then be automatically created at the precise location specified. A fiducial location could also be specified using CAD data to specify the location of the fiducial with respect to a particular structure on the wafer surface. As long as the transfer fiducials were created far enough away from the feature of interest (considering the accuracy of the stage navigation) suitable transfer fiducials could be safely created by this type of automated process.

Where transfer fiducials are created, a second high resolution image can be acquired and process steps 111-118 repeated in order to properly register the second image (showing the transfer fiducials) with the coordinate system.

In step 124, the suitable transfer fiducials (whether pre-existing or created) are then identified and the offset(s) between the transfer fiducials and the feature of interest are recorded.

In step 126, the recorded fiducial offsets are used to accurately locate the feature of interest so that the particle beam can be precisely positioned. One method of performing the final alignment would be to create an overlay over the fiducial in the high resolution image, for example by drawing a pattern box. If the user now acquires an image at higher at higher magnification, the target site can be found by lining up the marker and the pattern, e.g. by using beam shift. By using this novel process, the feature of interest can be located and particle beam placement controlled within ±30 nm or even less. This allows the sample to be processed, in step 128, with very accurate beam placement even though the sample stage alone is not capable of such precise navigation. In step 130, it is determined whether there are other samples to be processed. If yes, subsequent samples are loaded into the particle beam system and steps 111-130 are repeated (preferably automatically as described above). If not, the process stops.

FIG. 13 shows a typical dual beam FIB/SEM system 210 that could be used to implement preferred embodiments of the present invention. One embodiment of the present invention utilizes a dual beam FIB/SEM system 210 that uses an ion beam that is either normal or tilted by a few degrees to the plane of the sample surface and an electron beam having an axis that is also tilted, e.g., 52 degrees from the axis of ion beam. In some embodiments, the ion beam and electron beam are capable of aligning so that the fields of view of both beams are coincident to within a few microns or less. The ion beam is typically used to image and machine the work piece, and the electron beam is used primarily for imaging but can also be used for some modification of the work piece. The electron beam will typically produce an image of a higher resolution than the ion beam image, and it will not damage the viewed surface like the ion beam. The image formed by the two beams can look different, and the two beams can therefore provide more information than a single beam.

Such a dual beam system could be made from discrete components or alternatively, could be derived from a conventional device such as an Altura™ or an Expida™ system available from FEI Company of Hillsboro, Oreg. The present invention could also be implemented using other particle beam systems, including for example, single beam systems, such as FIB or SEM only systems, or dual beam systems having two FIB columns.

Focused ion beam system 210 includes an evacuated envelope 211 having an upper neck portion 212 within which are located an ion source 214 and a focusing column 216 including extractor electrodes and an electrostatic optical system. Ion beam 218 passes from ion source 214 through column 216 and between electrostatic deflection means schematically indicated at 220 toward sample 222, which comprises, for example, a semiconductor device positioned on movable X-Y-Z stage 224 within lower chamber 226. An ion pump or other pumping system (not shown) can be employed to evacuate neck portion 212. The chamber 226 is evacuated with turbomolecular and mechanical pumping system 230 under the control of vacuum controller 232. The vacuum system provides within chamber 226 a vacuum of between approximately $1 \times 10^{-7}$ Torr and $5 \times 10^{-4}$ Torr. If an etch assisting, an etch retarding gas, or a deposition precursor gas is used, the chamber background pressure may rise, typically to about $1 \times 10^{-5}$ Torr.

High voltage power supply 234 is connected to ion source 214 as well as to appropriate electrodes in focusing column 216 for forming an ion beam 218 and directing the same downwardly. Deflection controller and amplifier 236, operated in accordance with a prescribed pattern provided by pattern generator 238, is coupled to deflection plates 220 whereby beam 218 may be controlled to trace out a corresponding pattern on the upper surface of sample 222. In some systems the deflection plates are placed before the final lens, as is well known in the art.

The ion source 214 typically provides a metal ion beam of gallium, although other ion sources, such as a multicusp or other plasma ion source, can be used. The ion source 214 typically is capable of being focused into a sub one-tenth micron wide beam at sample 222 for either modifying the sample 222 by ion milling, enhanced etch, material deposition, or for the purpose of imaging the sample 222. A charged particle multiplier 240 used for detecting secondary ion or electron emission for imaging is connected to signal processor 242, where the signal from charged particle multiplier 240 are amplified, converted into digital signals, and subjected to signal processing. The resulting digital signal is to display an image of sample 222 on the monitor 244.

A scanning electron microscope 241, along with power supply and control unit 245, is also provided with the FIB/SEM system 210. An electron beam 243 is emitted from a cathode 252 by applying voltage between cathode 252 and an anode 254. Electron beam 243 is focused to a fine spot by means of a condensing lens 256 and an objective lens 258. Electron beam 243 is scanned two-dimensionally on the specimen by means of a deflection coil 260. Operation of condensing lens 256, objective lens 258, and deflection coil 260 is controlled by power supply and control unit 245.

Electron beam 243 can be focused onto sample 222, which is on movable X-Y-Z stage 224 within lower chamber 226. Scanning electron microscope 241 produces a finely focused electron beam 243, which is scanned across the surface of the structure, preferably in a raster pattern. When the electrons in the electron beam 243 strike the surface of work piece 222, secondary electrons and backscattered electrons are emitted. Respectively, these electrons are detected by secondary electron detector 240 or backscattered electron detector 262. The analog signal produced either by secondary electron detector 240 or backscattered electron detector 262 is amplified and converted into a digital brightness value by signal processor unit 242. The resulting digital signal can be displayed as an image of sample 222 on the monitor 244.

A door 270 is opened for inserting sample 222 onto stage 224, which may be heated or cooled, and also for servicing an internal gas supply reservoir, if one is used. The door is interlocked so that it cannot be opened if the system is under vacuum. The high voltage power supply provides an appropriate acceleration voltage to electrodes in ion beam column 216 for energizing and focusing ion beam 218.

A gas delivery system 246 extends into lower chamber 226 for introducing and directing a gaseous vapor toward sample 222. U.S. Pat. No. 5,851,413 to Casella et al. for "Gas Delivery Systems for Particle Beam Processing," assigned to the assignee of the present invention, describes a suitable gas delivery system 246. Another gas delivery system is described in U.S. Pat. No. 5,435,850 to Rasmussen for a "Gas Injection System," also assigned to the assignee of the present invention. For example, iodine can be delivered to enhance etching, or a metal organic compound can be delivered to deposit a metal.

System controller 219 controls the operations of the various parts of dual beam system 20. Through system controller 119, a user can cause ion beam 218 or electron beam 143 to be scanned in a desired manner through commands entered into a conventional user interface (not shown). System controller 119 can also comprise computer-readable memory 221 and may control dual beam system 110 in accordance with data or programmed instructions stored in memory 221. CAD data concerning the sample/semiconductor stored in memory 221 can be used to create a CAD polygon overlay or other positional data used to locate a feature of interest and alignment points or transfer fiducials as described above.

Although the description of the present invention above is mainly directed at a method of high-accuracy beam placement for local area navigation, it should be recognized that an apparatus performing the operation of this method would further be within the scope of the present invention. Further, it should be recognized that embodiments of the present invention can be implemented via computer hardware or software, or a combination of both. The methods can be implemented in computer programs using standard programming techniques—including a computer-readable storage medium configured with a computer program, where the storage medium so configured causes a computer to operate in a specific and predefined manner—according to the methods and figures described in this Specification. Each program may be implemented in a high level procedural or object oriented programming language to communicate with a computer system. However, the programs can be implemented in assembly or machine language, if desired. In any case, the language can be a compiled or interpreted language. Moreover, the program can run on dedicated integrated circuits programmed for that purpose.

Further, methodologies may be implemented in any type of computing platform, including but not limited to, personal computers, mini-computers, main-frames, workstations, networked or distributed computing environments, computer platforms separate, integral to, or in communication with charged particle tools or other imaging devices, and the like. Aspects of the present invention may be implemented in machine readable code stored on a storage medium or device, whether removable or integral to the computing platform, such as a hard disc, optical read and/or write storage mediums, RAM, ROM, and the like, so that it is readable by a programmable computer, for configuring and operating the computer when the storage media or device is read by the computer to perform the procedures described herein. Moreover, machine readable code, or portions thereof, may be transmitted over a wired or wireless network. The invention described herein includes these and other various types of computer-readable storage media when such media contain instructions or programs for implementing the steps described above in conjunction with a microprocessor or other data processor. The invention also includes the computer itself when programmed according to the methods and techniques described herein.

Computer programs can be applied to input data to perform the functions described herein and thereby transform the input data to generate output data. The output information is applied to one or more output devices such as a display monitor. In preferred embodiments of the present invention, the transformed data represents physical and tangible objects, including producing a particular visual depiction of the physical and tangible objects on a display.

Preferred embodiments of the present invention also make use of a particle beam apparatus, such as a FIB or SEM, in order to image a sample using a beam of particles. Such particles used to image a sample inherently interact with the sample resulting in some degree of physical transformation. Further, throughout the present specification, discussions utilizing terms such as "calculating," "determining," "measuring," "generating," "detecting," "forming," or the like, also refer to the action and processes of a computer system, or similar electronic device, that manipulates and transforms data represented as physical quantities within the computer system into other data similarly represented as physical quantities within the computer system or other information storage, transmission or display devices.

The invention has broad applicability and can provide many benefits as described and shown in the examples above. The embodiments will vary greatly depending upon the specific application, and not every embodiment will provide all of the benefits and meet all of the objectives that are achievable by the invention. Particle beam systems suitable for carrying out the present invention are commercially available, for example, from FEI Company, the assignee of the present application. However, even though much of the previous description is directed toward the use of FIB milling and imaging, the beam used to process the desired samples could comprise, for example, an electron beam, a laser beam, or a focused or shaped ion beam, for example, from a liquid metal ion source or a plasma ion source, or any other charged particle beam. Further, although much of the previous description is directed at particle beam systems, the invention could be applied to any suitable sample imaging system employing a moveable sample stage to navigate to the location of a sample feature.

Although much of the previous description is directed at semiconductor wafers, the invention could be applied to any suitable substrate or surface. Further, whenever the terms "automatic," "automated," or similar terms are used herein, those terms will be understood to include manual initiation of the automatic or automated process or step. In the following discussion and in the claims, the terms "including" and "comprising" are used in an open-ended fashion, and thus should be interpreted to mean "including, but not limited to . . . " The term "integrated circuit" refers to a set of electronic components and their interconnections (internal electrical circuit elements, collectively) that are patterned on the surface of a microchip. The term "semiconductor device" refers generically to an integrated circuit (IC), which may be integral to a semiconductor wafer, singulated from a wafer, or packaged for use on a circuit board. The term "FIB" or "focused ion beam" is used herein to refer to any collimated ion beam, including a beam focused by ion optics and shaped ion beams.

When the positional error or accuracy of the system stage or of beam placement or navigation is discussed herein, the terms ±100 nm (or ±30 nm or ±X nm) mean that the beam can be directed at a location on the sample within a maximum error of 100 nm (or 30 nm or x nm). The terms "accuracy of ±X nm" or "positioning accuracy of X nm or better" means that the accuracy is at least X nm and includes all smaller values. The term "accuracy of X nm or greater" means that the accuracy is at best X nm and includes all larger values.

To the extent that any term is not specially defined in this specification, the intent is that the term is to be given its plain and ordinary meaning. The accompanying drawings are intended to aid in understanding the present invention and, unless otherwise indicated, are not drawn to scale.

Although the present invention and its advantages have been described in detail, it should be understood that various changes, substitutions and alterations can be made to the embodiments described herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. A method for high accuracy beam placement and navigation to a feature of interest within a local area on a sample surface, comprising:
   loading a sample into a sample imaging system employing a moveable sample stage, and said sample imaging system including computer hardware and non-transitory computer memory storing computer instruction embodying a computer program;
   acquiring a first image of a local area on the sample using the sample imaging system at a first field of view, the first field of view being large enough to insure that the location of a feature of interest is included in the image based considering the accuracy of the imaging system, the first image including the location of the feature of interest and one or more alignment points near the feature of interest, and said first image also having a resolution such that the image pixel size is equal to or smaller than the alignment points;
   superimposing a coordinate system overlay on the first image, with the computer program, the coordinate system overlay representing idealized coordinates of features on the sample surface;
   registering the first image with the coordinate system with the computer program using a plurality of alignment points in the first image and corresponding idealized elements in the coordinate system overlay;
   after the image and the coordinate system have been registered, navigating the sample imaging system to the location of the feature of interest in the acquired first image using the known coordinates from the coordinate system;
   identifying one or more transfer fiducials in the first image, wherein said transfer fiducials comprise unique visible features on the sample surface that can be easily identified;
   recording the offset between the transfer fiducials and the feature of interest with the computer program;
   acquiring a second image of the sample surface using the sample imaging system at a second field of view, said second field of view being smaller than the first field of view and including the feature of interest and the one or more transfer fiducials;
   identifying the one or more transfer fiducials in the second image;
   using the recorded offset between the transfer fiducials and the feature of interest to precisely navigate the sample of imaging system to the location of the feature of interest.

2. The method of claim 1, wherein the resolution of the first image yields a pixel size within the range of 10-60 nm.

3. The method of claim 1, wherein the coordinate system overlay includes idealized geometric shapes that represent the locations of features on a semiconductor surface and that are visually displayed superimposed over the first image.

4. The method of claim 3, wherein the alignment points comprise one or more visible features in the first image that correspond to geometric shapes in the coordinate system overlay, and wherein the step of registering the first image with the coordinate system includes matching the first image with the coordinate system overlay so that the alignment points in the first image and the corresponding geometric shapes are aligned.

5. The method of claim 4, wherein the step of registering the first image with the coordinate system includes selecting the alignment points interactively by using a computer pointing device to indicate an alignment point in the first image and also using the computer pointing device to indicate the corresponding position in the coordinate system overlay.

6. The method of claim 1 in which registering the first image with the coordinate system comprises locating the one or more alignment points and determining the offset errors between the one or more alignment points and the corresponding features in the coordinate overlay.

7. The method of claim 6 in which registering the first image with the coordinate system comprises includes matching the alignment points in the first image with the corresponding elements in the coordinate system overlay and aligning the coordinate system overlay with the first image.

8. The method of claim 7 in which aligning the coordinate system overlay with the first image comprises shifting, rotating, stretching, or resizing the coordinate system overlay in order to match the first image with the coordinate system overlay.

9. The method of claim 1 further comprising, after registering the first image with the coordinate system using a plurality of alignment points in the first image and corresponding idealized features in the coordinate system overlay, re-imaging one or more additional sites with other alignment points near the feature of interest and averaging the offset error indicated by the different images.

10. The method of claim 1, wherein the step of registering the first image with the coordinate system is performed by automated computer script executed on a computer machine.

11. The method of claim 1 wherein the step of identifying one or more transfer fiducials in the first image comprises creating one or more suitable transfer fiducials on the sample near the location of the feature of interest.

12. The method of claim 11 in which creating one or more suitable transfer fiducials on the sample near the location of the feature of interest comprises milling a trench in the sample surface to use as a fiducial, said trench forming a frame completely surrounding the location of the feature of interest.

13. The method of claim 1 in which identifying one or more transfer fiducials in the magnified first image comprises creating one or more desired transfer fiducials within the local area but separated from the feature of interest.

14. The method of claim 13 in which the one or more desired transfer fiducials are created by ion beam sputtering or surface staining, gas-assisted etching or deposition, or electron beam induced gas-assisted etching or deposition.

15. The method of claim 13 further comprising, after creating the one or more desired transfer fiducials, re-imaging the local area and repeating the steps of:
  superimposing a coordinate system overlay on the first image, the coordinate system overlay representing idealized coordinates of features on the sample surface;
  registering the first image with the coordinate system using a plurality of alignment points in the first image and corresponding idealized features in the coordinate system overlay; and
  after the image and the coordinate system have been registered, navigating the sample imaging system to the location of the feature of interest in the acquired first image using the known coordinates from the coordinate system.

16. The method of claim 1 in which the first field of view is at least 100 µm×100 µm.

17. The method of claim 1 in which the second field of view is 10% of the size of the first field of view or less.

18. The method of claim 6 in which the offset errors are used to position the particle beam before acquiring the second image.

19. A charged particle system including a non-transitory memory storing computer instructions to perform the step of claim 1.

20. A method for accurately locating a feature of interest on a sample in a particle beam system, comprising:
  loading a sample into a particle beam system employing a movable sample stage, and using the particle beam system to carry of the steps of:
  imaging a target area of the sample with a particle beam to obtain a first image, the target area including the location of a feature of interest and one or more additional visible alignment features having known coordinates, said first image being of a high enough resolution that the first image pixel size is no more than twice the size of any of said alignment features;
  superimposing a graphical representation of a coordinate system over the first image, the coordinate system using idealized geometric shapes to represent the locations of visible features within the target area;
  locating the one or more alignment features having known coordinates within the first image;
  determining an offset error between the superimposed coordinate system and the first image;
  aligning the coordinate system with the first image;
  locating within the first image one or more unique visible sample features on the surface of the sample to serve as transfer fiducials;
  recording the offset between the transfer fiducials and the location of the feature of interest;
  acquiring a second image of the sample with a particle beam at the location of the feature of interest, the second image having a smaller field of view than the first image;
  locating the transfer fiducials in the second image;
  locating the feature of interest within the second image using the recorded offset between the transfer fiducials and the feature of interest;
  using the location of the feature of interest to control the placement of a particle beam; and
  processing the sample using the particle beam.

21. The method of claim 20, wherein the alignment features comprise one or more visible features in the first image that correspond to geometric shapes in the superimposed coordinate system, and wherein the step of aligning the coordinate system with the first image includes matching the first image with the superimposed coordinate system so that the alignment features in the first image and the corresponding geometric shapes are aligned.

22. The method of claim 20 in which aligning the coordinate system with the first image comprises shifting, rotating, stretching, or resizing the superimposed coordinate system in order to match the first image with the superimposed coordinate system.

23. The method of claim 20 further comprising, after aligning the coordinate system with the first image using a plurality of alignment features in the first image and corresponding idealized features in the superimposed coordinate system, re-imaging one or more additional sites with other alignment features near the feature of interest and averaging the offset error indicated by the additional images.

24. The method of claim 20, wherein the steps of determining an offset error between the superimposed coordinate system and the first image and aligning the coordinate system with the first image are performed by automated computer script executed on a computer machine.

25. The method of claim 20, wherein the steps of locating the feature of interest within the second image using the recorded offset between the transfer fiducials and the feature of interest and using the location of the feature of interest to control the placement of a particle beam are performed by automated computer script executed on a computer machine.

26. The method of claim 1 wherein the step of locating within the first image one or more unique visible sample features on the surface of the sample to serve as transfer fiducials comprises creating one or more suitable transfer fiducials on the sample near the location of the feature of interest.

27. The method of claim 26 in which creating one or more suitable transfer fiducials on the sample near the location of the feature of interest comprises milling a trench in the sample surface to use as a fiducial, said trench forming a frame completely surrounding the location of the feature of interest.

28. The method of claim 20 in which the first image has a field of view that is at least 100 µm×100 µm.

29. The method of claim 28 in which the second image has a field of view that is 10% or less of the size of the field of view of the first image.

30. A charged particle system including a non-transitory memory storing computer instructions to perform the step of claim 20.

31. A method for navigating a sample without relying on stage movements, the sample having a target area with a feature of interest and one or more alignment points, the method comprising loading the sample into a sample imaging system, said sample imaging system including a computer program embodied in computer instructions stored in non-transitory computer memory and executed on a computer hardware system for carrying out the following steps:
- acquiring a first image of the target area;
- overlaying the image with an idealized coordinate system of alignment points within the target area;
- locating one or more of the alignment points within the image near the feature of interest;
- aligning the idealized coordinate system with the image;
- locating one or more unique features on the sample within the target area but separated from the sample;
- recording the offset between the feature of interest and the unique features in the first image;
- acquiring a new image of the sample with a smaller field of view, the new image including the feature of interest; and
- locating the feature of interest in the new image.

32. The method of claim 31, wherein the steps of acquiring a first image of the target area; overlaying the image with an idealized coordinate system of alignment points within the target area; locating one or more of the alignment points within the image near the feature of interest; aligning the idealized coordinate system with the image; locating one or more unique features on the sample within the target area but separated from the sample; recording the offset between the feature of interest and the unique features in the first image; acquiring a new image of the sample with a smaller field of view, the new image including the feature of interest; and locating the feature of interest in the new image are performed by automated computer script executed on a computer machine, said computer machine operably connected to a particle beam system.

33. An apparatus for accurately locating a feature of interest on a sample, comprising:
- a moveable sample stage for supporting the sample;
- a particle beam column for producing a beam of particles to image the sample; and
- a computer-readable memory storing computer instructions, the instructions including a program for controlling the apparatus and causing the apparatus to carry out the steps of:
  - (i) acquiring a first image of the target area;
  - (ii) overlaying the image with an idealized coordinate system of alignment points within the target area;
  - (iii) precisely locate one or more of the alignment points within the image near the feature of interest;
  - (iv) aligning the idealized coordinate system with the image;
  - (v) locating one or more unique features on the sample within the target area but separated from the sample;
  - (vi) recording the offset between the feature of interest and the unique features in the first image;
  - (vii) acquiring a new image of the sample with a smaller field of view, the new image including the feature of interest;
  - (viii) locating the feature of interest in the new image; and
  - (ix) using the location of the feature of interest to control the placement of a particle beam relative to the sample.

34. The apparatus of claim 33 in which the sample stage has positional error of ±500 nm or greater and in which the particle beam can be positioned relative to sample with a positional error of ±100 nm or smaller.

35. The apparatus of claim 33 in which the particle beam can be positioned relative to the sample with a positional error of ±30 nm or smaller.

* * * * *